(12) United States Patent
Lee et al.

(10) Patent No.: US 11,810,638 B2
(45) Date of Patent: Nov. 7, 2023

(54) MEMORY DEVICE INCLUDING MULTIPLE MEMORY CHIPS AND DATA SIGNAL LINES AND A METHOD OF OPERATING THE MEMORY DEVICE

(71) Applicant: SAMSUNG ELECTRONICS CO., LTD., Suwon-si (KR)

(72) Inventors: Seonkyoo Lee, Hwaseong-si (KR); Chiweon Yoon, Seoul (KR); Byunghoon Jeong, Hwaseong-si (KR); Youngmin Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 17/410,210

(22) Filed: Aug. 24, 2021

(65) Prior Publication Data

US 2022/0101894 A1    Mar. 31, 2022

(30) Foreign Application Priority Data

Sep. 29, 2020  (KR) .................. 10-2020-0127483
Feb. 3, 2021   (KR) .................. 10-2021-0015653

(51) Int. Cl.
*G11C 7/10*   (2006.01)
*H01L 25/065* (2023.01)
*G06F 13/42*  (2006.01)

(52) U.S. Cl.
CPC ........ *G11C 7/1048* (2013.01); *H01L 25/0657* (2013.01); *G06F 13/4282* (2013.01); *G11C 2207/12* (2013.01); *H01L 2225/06506* (2013.01); *H01L 2225/06562* (2013.01)

(58) Field of Classification Search
CPC .............. G11C 7/1048; G11C 2207/12; H01L 25/0657; H01L 2225/06506; H01L 2225/06562; G06F 13/4282; G06F 2207/12
USPC ..................................................... 365/189.14
See application file for complete search history.

(56) References Cited

U.S. PATENT DOCUMENTS

| 8,683,164 | B2 | 3/2014 | Jeddeloh |
| 8,811,055 | B2 * | 8/2014 | Yoon ................. G11C 5/02 365/189.05 |
| 10,403,375 | B2 | 9/2019 | Lee et al. |
| 10,497,412 | B2 | 12/2019 | Lee et al. |

(Continued)

*Primary Examiner* — Ly D Pham
(74) *Attorney, Agent, or Firm* — F. CHAU & ASSOCIATES, LLC

(57) ABSTRACT

An operating method of a memory device includes selecting a receiver from a plurality of receivers of each memory chip of a plurality of memory chips included in the memory device as a first receiver. The plurality of memory chips share a plurality of data signal lines, each memory chip includes a plurality of on-die termination (ODT) resistors, and the plurality of ODT resistors are respectively connected to the plurality of receivers of each memory chip. The method further includes setting each ODT resistor which is connected to a first receiver to a first resistance value, setting ODT resistors which are connected to receivers which are not first receivers to a second resistance value, and setting an amplification strength of an equalizer circuit of each first receiver by performing training operations. Each data signal line of the plurality of data signal lines is respectively connected to a first receiver.

20 Claims, 13 Drawing Sheets

(56) References Cited

U.S. PATENT DOCUMENTS

| | | |
|---|---|---|
| 10,725,682 B2 | 7/2020 | Kim et al. |
| 10,755,797 B2 | 8/2020 | Kim et al. |
| 10,771,295 B2 * | 9/2020 | Stojanovic ............ H04L 25/061 |
| 11,313,904 B2 * | 4/2022 | Chen ................. G01R 31/31716 |
| 2010/0325372 A1 | 12/2010 | Housty et al. |
| 2016/0180898 A1 | 6/2016 | Hwang et al. |
| 2017/0075592 A1 * | 3/2017 | Debrosse ............. G11C 7/1003 |
| 2018/0342274 A1 * | 11/2018 | Son .......................... H03H 7/38 |
| 2019/0384491 A1 * | 12/2019 | Park ...................... G06F 3/0688 |
| 2021/0174861 A1 * | 6/2021 | Kim ................... G11C 11/4093 |
| 2022/0269419 A1 * | 8/2022 | Kim ........................ G11C 7/20 |

\* cited by examiner

MEMORY DEVICE INCLUDING MULTIPLE MEMORY CHIPS AND DATA SIGNAL LINES AND A METHOD OF OPERATING THE MEMORY DEVICE

CROSS-REFERENCE TO RELATED APPLICATIONS

This application claims priority under 35 U.S.C. § 119 to Korean Patent Application No. 10-2020-0127483, filed on Sep. 29, 2020, and Korean Patent Application No. 10-2021-0015653, filed on Feb. 3, 2021, in the Korean Intellectual Property Office, the disclosures of which are incorporated by reference herein in their entirety.

TECHNICAL FIELD

The inventive concept relates to a memory device, and more particularly, to a memory device including multiple memory chips and data signal lines, and a method of operating the memory device.

DISCUSSION OF RELATED ART

Communication speeds between a controller and a memory device have increased in memory systems which include high-speed memory devices such as dynamic random-access memory (DRAM) devices or static random-access memory (SRAM) devices. The controller and the memory device may communicate in such a system by transmitting and receiving high-speed signal through a channel.

SUMMARY

An embodiment of the inventive concept provides a memory device including multiple memory chips and data signal lines and an operating method of the memory device.

According to an embodiment of the inventive concept, an operating method of a memory device includes selecting a receiver from a plurality of receivers of each memory chip of a plurality of memory chips included in the memory device as a first receiver in response to a selection control signal, where the plurality of memory chips share a plurality of data signal lines, each memory chip includes a plurality of on-die termination (ODT) resistors, and the plurality of ODT resistors are respectively connected to the plurality of receivers of each memory chip. The method further includes setting each ODT resistor which is connected to a first receiver to a first resistance value in response to mode register setting command signals, setting ODT resistors which are connected to receivers which are not first receivers to a second resistance value, and setting an amplification strength of an equalizer circuit of each first receiver by performing training operations. Each data signal line of the plurality of data signal lines is respectively connected to a first receiver.

According to an embodiment of the inventive concept, an operating method of a memory device includes selecting a first group and a second group of a plurality of memory chips included in the memory device, where the plurality of memory chips share a plurality of data signal lines, selecting a plurality of receivers in each memory chip in the first group as first receivers, setting resistance values of on-die termination (ODT) resistors included in each memory chip, where each ODT resistor is respectively connected to a receiver of the plurality of receivers, and setting an amplification strength of an equalizer circuit of each first receiver by performing training operations. Each data signal line is respectively connected to a first receiver.

According to an embodiment of the inventive concept, a memory device includes a plurality of memory chips which share a plurality of data signal lines. Each of the plurality of memory chips includes a plurality of input/output pads which are respectively connected to the plurality of data signal lines and a plurality of on-die termination (ODT) resistors which are respectively connected to the input/output pads. Each of the plurality of memory chips is configured to select a first pad from among the plurality of input/output pads in response to a selection control signal, set an ODT resistor which is connected to the first pad to a first resistance value in response to a mode register setting command signal, and set each ODT resistor which is connected to a non-selected input/output pad of the plurality of input/output pads to a second resistance value. Each data signal line is respectively connected to a first pad.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
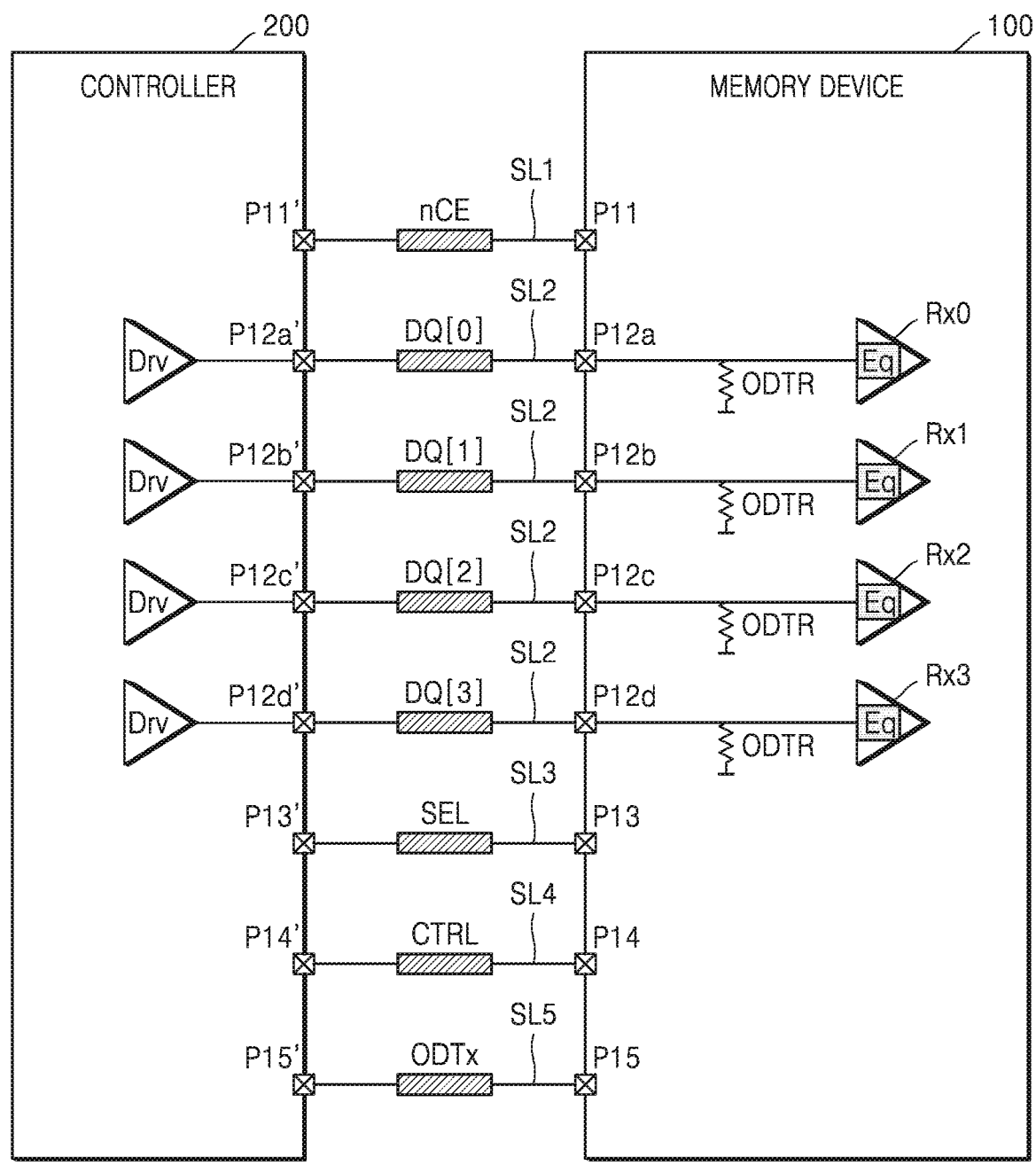
FIG. 1 is a block diagram of a memory system according to an embodiment of the inventive concept.

Embodiments of the inventive concept will be described more fully hereinafter with reference to the accompanying drawings. Like reference numerals may refer to like elements throughout the accompanying drawings, and repeated descriptions of like elements may be omitted.

It will be understood that although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments of the inventive concept.

As used herein, the singular forms "a," "an", and "the" are intended to include the plural forms as well, unless the context clearly indicates otherwise.

FIG. 1 is a block diagram of a memory system 10 according to an embodiment of the inventive concept.

Referring to FIG. 1, a memory system 10 may include a memory device 100 and a controller 200, and the memory device 100 and the controller 200 may be connected to each other via a channel. For example, the memory device 100 and the controller 200 may be connected to each other according to a memory interface protocol provided by the Toggle standard, such as a Toggle DDR 4.0 interface. However, embodiments of the inventive concept are not necessarily limited thereto, and the memory device 100 and the controller 200 may be connected to each other according to various standard interfaces.

As described below with reference to FIG. 2, the memory device 100 may include a plurality of memory chips, and the plurality of memory chips may be connected to the controller 200 via the channel. Accordingly, the plurality of memory chips may communicate with the controller 200 through a plurality of signal lines which may be included in the channel.

The memory system 10 may include a plurality of input/output pins which may transmit a signal input and/or output between the memory device 100 and the controller 200. The input/output pins may refer to conductors, and may be referred to as terminals.

The memory device 100 may be connected to the controller 200 through the channel, which may include first to fifth signal lines SL1 to SL5. The memory device 100 may include a first plurality of input/output pins, for example, first to fifth input/output pins P11 to P15, which respectively correspond to the first to fifth signal lines SL1 to SL5. The first to fifth input/output pins P11 to P15 included in the memory device 100 may respectively correspond to a second plurality of input/output pins P11' to P15' which may be included in the controller 200.

The memory device 100 and the controller 200 may be connected to each other through the first signal line SL1. The memory device 100 may receive a chip enable signal nCE from the controller 200 through the first pin P11. The first signal line SL1 may be referred to as a chip enable signal line. In an embodiment, the memory system 10 may support a chip enable reduction (CER) mode, and the plurality of memory chips included in the memory device 100 may share the first signal line SL1 in common. However, embodiments of the inventive concept are not necessarily limited thereto. For example, the memory device 100 may include a plurality of first signal lines SL1 which may respectively correspond to each of the plurality of memory chips.

The memory device 100 and the controller 200 may be connected to each other through a plurality of second signal lines SL2. The memory device 100 may receive a command and an address through the second signal lines SL2 from the controller 200, and may transmit and receive a data signal DQ to and from the controller 200. The second signal lines SL2 may be referred to as data signal lines. For example, the second signal lines SL2 may include a plurality of data signal lines DQ[0] to DQ[3], and the memory device 100 may include a plurality of pins P12a to P12d which may respectively correspond to the plurality of data signal lines DQ[0] to DQ[3].

The memory device 100 may include a plurality of receivers, for example, first to fourth receivers Rx0 to RX3, respectively connected to the second signal lines SL2. Each of the first to fourth receivers Rx0 to Rx3 may convert an input signal of a CML level received from the controller 200 through the second signal line SL2 into a CMOS level and may output an internal signal. The memory device 100 may perform a write operation and a read operation on a memory cell which may be included in the memory device in response to the internal signal(s).

Each of the first to fourth receivers Rx0 to Rx3 may include an equalizer circuit Eq therein. As a signal from an output driver Drv of the controller 200 passes through the second signal lines SL2 to the memory device 100, inter-symbol interference (ISI) may attenuate a high-frequency component of the signal. The equalizer circuit Eq may compensate for this attenuation by amplifying a voltage difference between the signal received through the second signal lines SL2 and a reference voltage level. An amplification strength of the equalizer circuit Eq may be determined based on a control code, and the memory device 100 may change the control code in response to a command received from the controller 200.

The memory device 100 may perform training operations corresponding to the equalizer circuit Eq in response to commands received from the controller 200, and may determine an optimal amplification strength of the equalizer circuit Eq based on the training operations. The training operations may be implemented as a firmware code in the controller 200, and the memory device 100 may implement the training operations based on commands received from the controller 200. In FIGS. 4 through 7 below, a receiver RX may include the equalizer circuit Eq.

The memory device 100 may include an on-die termination (ODT) resistor ODTR connected to each of the second signal lines SL2. The controller 200 may adjust an amount of reflection of a signal provided by the controller 200 to the memory device 100 by setting a resistance value of the ODT resistor ODTR, which may improve an integrity of the signal. The controller 200 may set the resistance value of the ODT resistor ODTR by providing mode register setting commands which are suitable for mode registers of the memory chips to the memory device 100.

The ODT resistor ODTR may be set to have a target ODT resistance value or a non-target ODT resistance value. In some embodiments, an ODT resistor ODTR which corresponds to the first receiver Rx0 may be set to have a target ODT resistance value, and a signal received by the memory device 100 through the second signal lines SL2 may be impedance matched. Accordingly, the first receiver Rx0 may receive a signal with low noise. A target ODT resistance value may be referred to herein as a first resistance value.

In some embodiments, the ODT resistor ODTR which corresponds to the first receiver Rx0 may be set to a non-target ODT resistance value, and a signal received by the memory device 100 through the second signal lines SL2 may be suppressed from being reflected and may be absorbed. Accordingly, the amount of reflection of the signal may be reduced, and thus the remaining second to fourth receivers Rx2 to Rx4 may receive a signal with low noise. A non-target ODT resistance value may be referred to herein as a second resistance value.

The memory device 100 may receive a selection control signal SEL from the controller 200 through the third signal line SL3. The selection control signal SEL may include a plurality of values which respectively correspond to each of the second signal lines SL2. The memory device 100 may select one receiver for each second signal line SL2 in response to the selection control signal SEL.

The memory device 100 may receive a control signal CTRL from the controller 200 through the fourth signal line SL4. The control signal CTRL may include control code information, and the memory device 100 may determine an amplification strength of the equalizer circuit Eq by generating the control code and providing the control code to the equalizer circuit Eq in response to the control code information.

The memory device 100 may receive an ODT control signal ODTx from the controller 200 through the fifth signal line SL5. The memory device 100 may enable or disable the ODT resistors ODTR respectively connected to the second signal lines SL2 in response to the ODT control signal ODTx. When the ODT resistors ODTR are enabled, the OTD resistors ODTR may provide set resistance values.

In some embodiments, the memory device 100 may include a plurality of nonvolatile memory chips which may share one channel in common. For example, the plurality of nonvolatile memory chips may be NAND flash memory chips. However, embodiments of the inventive concept are not necessarily limited thereto, and at least one of the plurality of nonvolatile memory chips may be a resistive memory chip such as a resistive RAM (ReRAM) chip, a phase-change RAM (PRAM) chip, or a magnetic RAM (MRAM) chip.

Also, embodiments of the memory device 100 according to the inventive concept are not necessarily limited to a nonvolatile memory device, and the memory device 100 may include double data rate synchronous DRAM (DDR SDRAM), high bandwidth memory (HBM), a hybrid memory cube (HMC), a dual in-line memory module (DIMM), an Optane DIMM, or nonvolatile DIMM (NVMDIMM).

In some embodiments, the memory system 10 may be an internal memory embedded in an electronic device. For example, the memory system 10 may be a solid-state drive (SSD), an embedded universal flash storage (UFS) memory system, or an embedded multi-media card (eMMC). In some embodiments, the memory system 10 may be an external memory which may be attachable to and/or detachable from an electronic device. For example, the memory system 10 may be a UFS memory card, a compact flash (CF) card, a secure digital (SD) card, a micro secure digital (micro-SD) card, a mini secure digital (mini-SD) card, an extreme digital (xD) card, or a memory stick.

Figure 2:
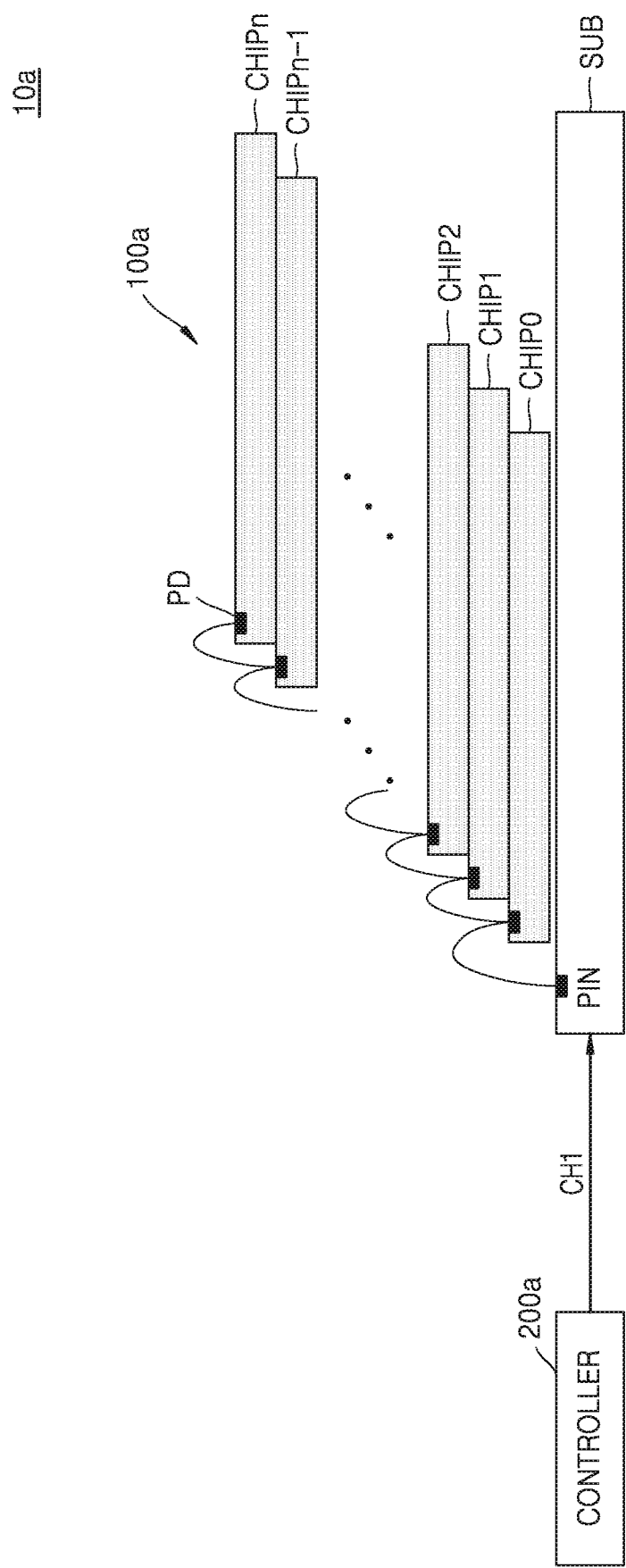
FIG. 2 is a diagram of a memory system according to an embodiment of the inventive concept.

FIG. 2 is a diagram of a memory system 10a according to an embodiment of the inventive concept.

Referring to FIG. 2, the memory system 10a may include a memory device 100a and a controller 200a. The memory device 100a may include a multi-stack memory in which a plurality of memory chips, for example, first to $n^{th}$ memory chips CHIP0 to CHIPn, may be stacked and may be referred to as a package chip. For example, the memory device 100a may include a substrate SUB, and the first to $n^{th}$ memory chips CHIP0 to CHIPn may be stacked on the substrate SUB.

The first to $n^{th}$ memory chips CHIP0 to CHIPn may share a channel CH1 in common. For example, a data input/output pin PIN may be disposed on the substrate SUB, and the data input/output pin PIN may be connected by wire bonding to an input/output pad PD included in each of the first to $n^{th}$ memory chips CHIP0 to CHIPn. In an embodiment, the first to $n^{th}$ memory chips CHIP) to CHIPn connected by wire bonding to the data input/output pin PIN may be stacked in a staircase manner, so that a portion of each memory chip does not overlap the memory chips disposed below.

The first to $n^{th}$ memory chips CHIP0 to CHIPn may have different signal path characteristics. For example, the first to $n^{th}$ memory chips CHIP0 to CHIPn may have different relative distances from the channel CH1, and thus a degree of attenuation of a high-frequency component of a signal received from the controller 200a through the channel CH1 may be different for each memory chip.

In addition, although only one package chip is illustrated in FIG. 2, the memory device 100a may include a multi-chip package which includes a plurality of package chips. Each memory chip included in each package chip of the multi-chip package may have a different relative distance from the channel CH1, and thus a degree of attenuation of a high-frequency component of a signal received from the controller 200a through the channel CH1 may be different for each memory chip.

That is, because the memory chip may have different signal path characteristics from each other, the memory device 100a may determine an optimal amplification strength of the equalizer circuits of each memory chip. Hereinafter, memory device operations which may determine the optimal amplification strengths of the equalizer circuits of the memory chips of the memory device will be described with reference to FIGS. 3 through 11.

Figure 3:
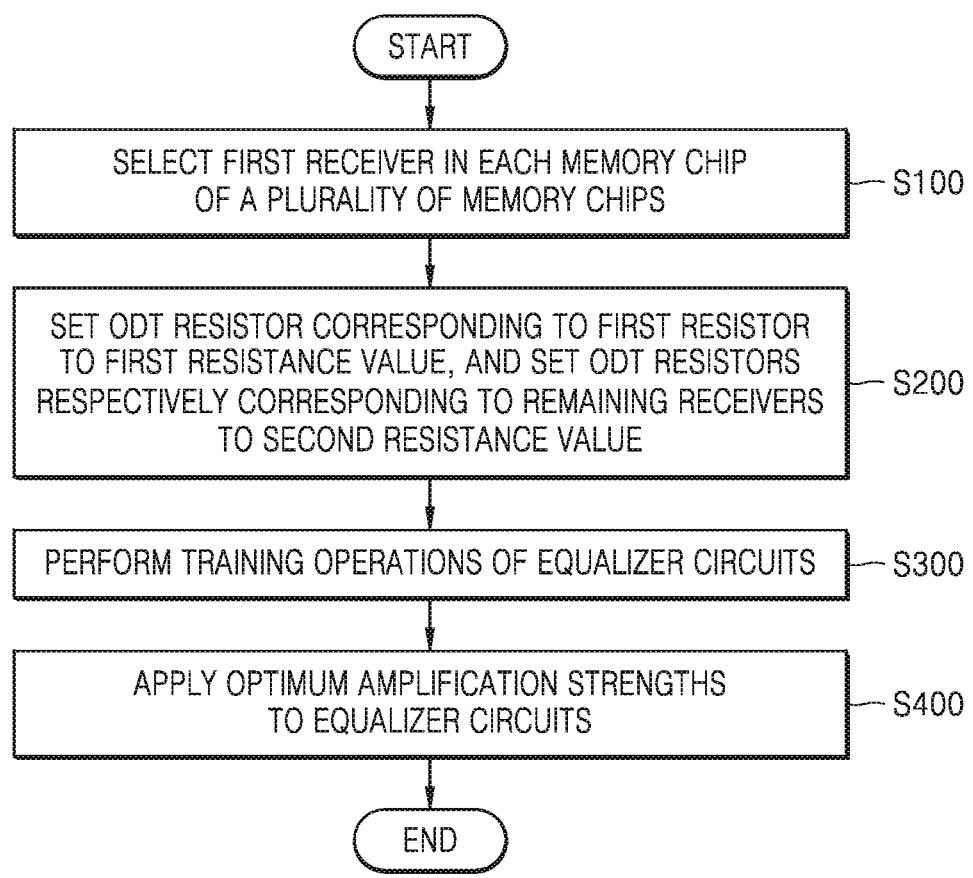
FIG. 3 is a flowchart of an operating method of a memory device according to an embodiment of the inventive concept.

FIG. 3 is a flowchart of an operating method of a memory device according to an embodiment of the inventive concept.

Referring to FIG. 3, in operation S100, in response to a selection control signal received by a memory device from a controller, the memory device may select at least one receiver from among a plurality of receivers in each memory chip of a plurality of memory chips as a first receiver. The plurality of memory chips may share a plurality of data signal lines, and each data signal line may respectively correspond to a first receiver.

In operation S200, in response to mode register setting command signals received by the memory device from the controller, the memory device may set each ODT resistor which is connected to a first receiver to a first resistance value and may set each ODT resistor which is connected to a receiver which is not a first receiver to a second resistance value.

In operation S300, in response to command signals received by the memory device from the controller, the memory device may simultaneously perform training operations of equalizer circuits included in the memory chips. In an embodiment, the training operations may include simultaneously activating the plurality of memory chips and enabling ODT resistors included in each memory chip in response to an ODT control signal. In an embodiment, the training operations may include setting the ODT resistors which are connected to first receivers to a first resistance value, and setting ODT resistors which are not connected to first receivers to a second resistance value. In an embodiment, the training operations may include generating a control code in response to a control signal comprising control code information, where the amplification strength of an equalizer circuit may be based on the control code and may correspond to an amplification strength interval from among a plurality of amplification strength intervals, programming write data to a memory cell in response to a write command signal, and generating read data by reading the write data programmed to the memory cell in response to a read command signal. In an embodiment, the training operations may include disabling the ODT resistors included in each memory chip in response to an ODT control signal before generating the read data. In an embodiment, the training operations may be repeated for each amplification strength interval of the plurality of strength intervals. In an embodiment, the training operations may include determining an optimal amplification strength for each equalizer circuit of each first receiver.

As the plurality of memory chips may be simultaneously activated in response to a chip enable signal. and because only one first receiver is connected to an ODT resistor with a first resistance value for each data signal line and may be enabled to receive a signal, the plurality of memory chips may be trained in the same manner as one memory chip may be trained. Accordingly, it is possible to simultaneously determine an amplification strength of an equalizer circuit having an optimal signal reliability and data eye-diagram for each of the plurality of memory chips.

Since a first receiver is connected to each data signal line, it is possible to simultaneously train other memory chips while training a memory chip. If training is not performed simultaneously, the training of the memory chips proceeds sequentially, so there is a problem that the training time takes as much as the sum of the training times of all memory chips serially. Training a plurality of chips simultaneously solves this problem. According to the inventive concept, a time required for training may be reduced and the efficiency of a reception interface may be increased by simultaneously performing training operations of equalizer circuits for a plurality of memory chips which share a channel.

In operation 400, the memory device may apply the optimal amplification strength of equalizer circuits of each first receiver to other equalizer circuits of other receivers. For example, as described below with reference to FIGS. 4 and 10, the memory device may apply an amplification strength of an equalizer circuit included in a first receiver of a memory chip to each receiver of the plurality of receivers of the memory chip. Also, as described below with reference to FIGS. 5 and 10, the memory device may apply any one of an average value, a maximum value, and a minimum value of the amplification strengths of a plurality of first receivers of a memory chip to each receiver of the memory chip. An amplification strength mismatch or an error which may occur when only one receiver in a memory chip is selected as a first receiver may be mitigated by selecting a plurality of receivers as first receivers in each memory chip.

Figure 4:
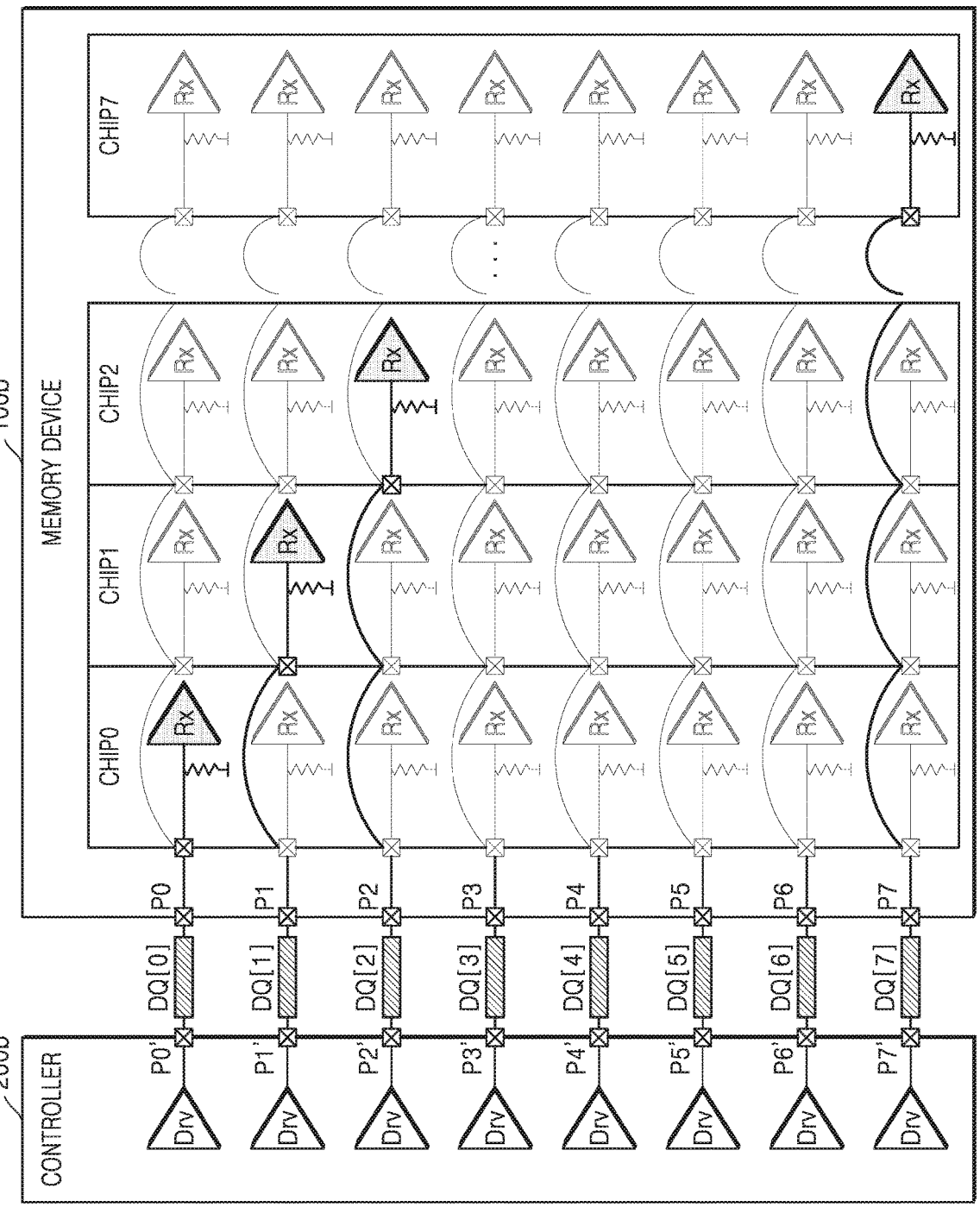
FIG. 4 is a block diagram which illustrates an operation of a memory device according to an embodiment of the inventive concept.

FIG. 4 is a block diagram which illustrates an operation of a memory device according to an embodiment of the inventive concept. In detail, FIG. 4 is a diagram which illustrates a selection of receivers as first receivers in a memory system in which a number of a plurality of memory chips in a memory device which share a channel is equal to a number of data signal lines in the channel.

Referring to FIG. 4, a memory system 10b may include a memory device 100b, a controller 200b, and a channel. The channel may include a plurality of data signal lines, for example first to eighth data signal lines DQ[0] to DQ[7]. The memory device 100b may include a plurality of memory chips, for example, first to eighth memory chips CHIP0 to CHIP7, which may share the channel. The controller 200b may include a plurality of output drivers Dry and a plurality of controller input/output pins, for example first to eighth controller input/output pins P0' to P7', and the plurality of output drivers Dry and the plurality of controller input/output pins may respectively correspond to the plurality of data signal lines.

The first to eighth memory chips CHIP0 to CHIP7 which share the channel may be implemented as a package chip. The memory device 100b may include a plurality of input/output pins, for example first to eighth input/output pins P0 to P7, and the first to eighth input/output pins P0 to P7 may be respectively connected to the first to eighth data signal lines DQ[0] to DQ[7]. The first to eighth memory chips CHIP0 to CHIP7 may include a plurality of input/output pads respectively connected by wire bonding to the first to eighth input/output pins P0 to P7. For example, when the first memory chip CHIP0 is enabled, a signal received through the first to eighth input/output pins P0 to P7 from the output drivers Dry may be transmitted through the input/output pads of the first memory chip CHIP0 to the first memory chip CHIP0.

In an embodiment, where the number of the plurality of memory chips which share the channel and the number of the plurality of data signal lines in the channel are the same, the controller 200b may select a receiver Rx in each memory chip as a first receiver, and each first receiver may respectively correspond to a data signal line of the plurality of data signal lines.

For example, as illustrated by the darkened areas of FIG. 4, the controller 200b may select a receiver Rx which is connected to the first data signal line DQ[0] in the first memory chip CHIP0 as a first receiver, the controller 200b may select a receiver Rx which is connected to the second data signal line DQ[1] in the second memory chip CHIP1 as a first receiver, and so on, until each data signal line of the plurality of data signal lines is connected to a receiver Rx which has been selected as a first receiver.

As described below with reference to FIG. 11, after the training operations are performed and amplification strengths of each equalizer circuit of each first receiver are set to an optimal amplification strength, the memory device may apply the amplification strength of an equalizer circuit included in a first receiver of a memory chip to each equalizer circuit of the memory chip.

However, embodiments of the inventive concept are not necessarily limited thereto. For example, as described below with reference to FIGS. 5 and 7, multiple first receivers may be selected per memory chip.

Figure 5:
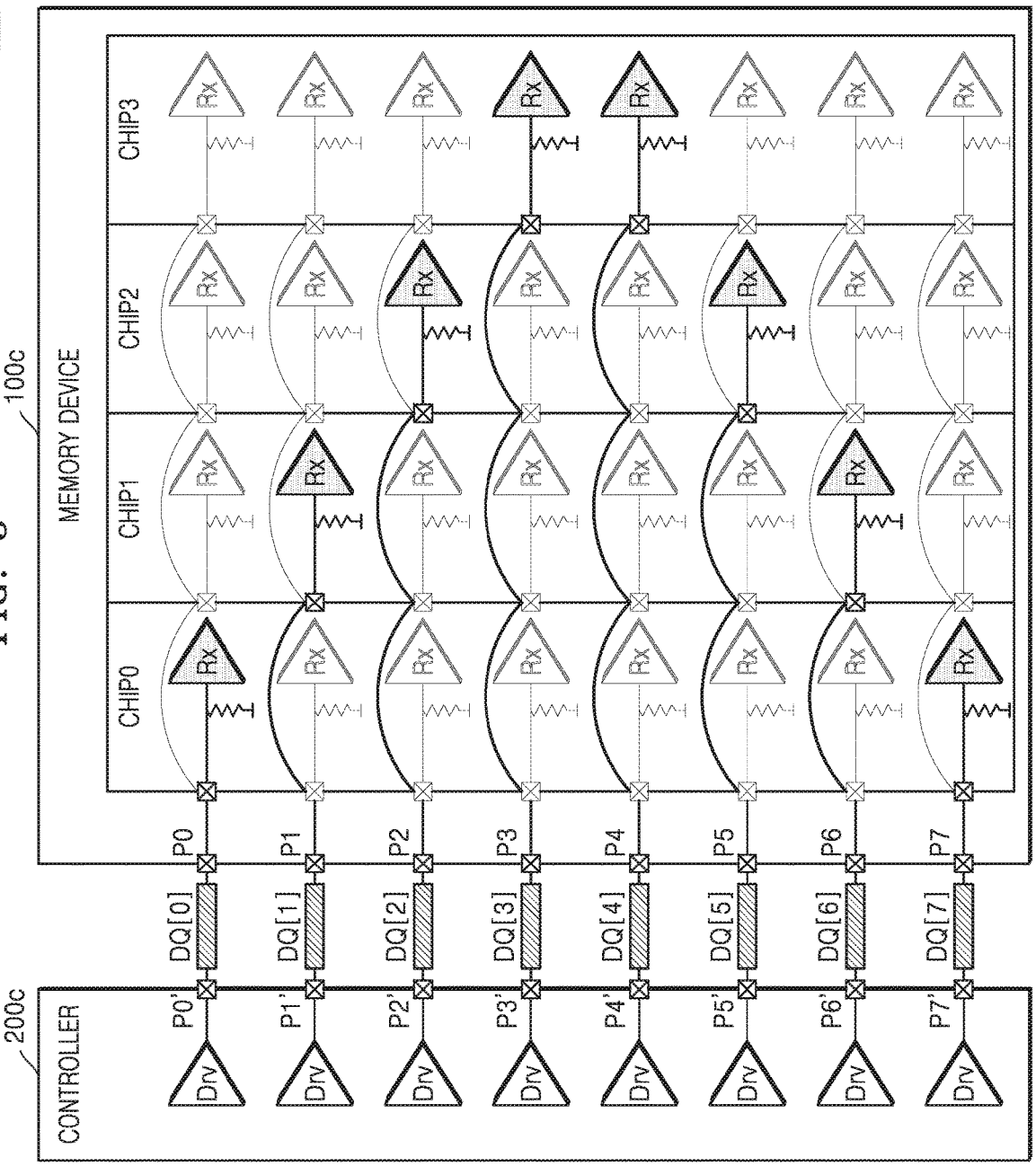
FIG. 5 is a block diagram which illustrates an operation of a memory device according to an embodiment of the inventive concept.

FIG. 5 is a block diagram which illustrates an operation of a memory device according to an embodiment of the inventive concept. In detail, FIG. 5 is a diagram which illustrates a selection of receivers as first receivers in a memory system in which a number of data signal lines in a channel is greater than a number of a plurality of memory chips in a memory device which share the channel.

Referring to FIG. 5, memory system 10c may include a memory device 100c, a controller 200c, and a channel which includes a plurality of data signal lines, for example first to eighth data signal lines DQ[0] to DQ[7]. The memory device 100c may include a plurality of memory chips, for example first to fourth memory chips CHIP0 to CHIP3.

In an embodiment, where the number of the plurality of data signal lines is greater than the number of the plurality of memory chips which share the channel, the controller 200c may select multiple receivers Rx as first receivers from each memory chip, and each first receiver may respectively correspond to a data signal line of the plurality of data signal lines.

For example, as illustrated by the darkened areas of FIG. 5, the controller 200c may select a receiver Rx which is connected to the first data signal line DQ[0] in the first memory chip CHIP0 and a receiver Rx which is connected to the eighth data signal line DQ[7] in the first memory chip CHIP0 as first receivers. Accordingly, two first receivers may be selected in the first memory chip CHIP0.

Likewise, the controller 200c may select a receiver Rx which is connected to the second data signal line DQ[1] in the second memory chip CHIP1 and a receiver Rx which is connected to the seventh data signal line DQ[6] in the second memory chip CHIP1 as first receivers, and so on, until each data signal line of the plurality of data signal lines is connected to a receiver Rx which has been selected as a first receiver.

As described below with reference to FIG. 11, after the training operations are performed and amplification strengths of each equalizer circuit of each first receiver are set to an optimal amplification strength, the memory device may apply any one of an average value, a maximum value, and a minimum value of the amplification strengths of equalizer circuits included in the first receivers of a memory chip to the equalizer circuits of the memory chip.

Accordingly, an operating method of a memory device according to an embodiment of the inventive concept may reduce an amplification strength mismatch or an error which may occur when only one first receiver is selected from a plurality of receivers in a memory chip by selecting multiple first receivers from the plurality of memory receivers in the memory chip.

Figure 6A:
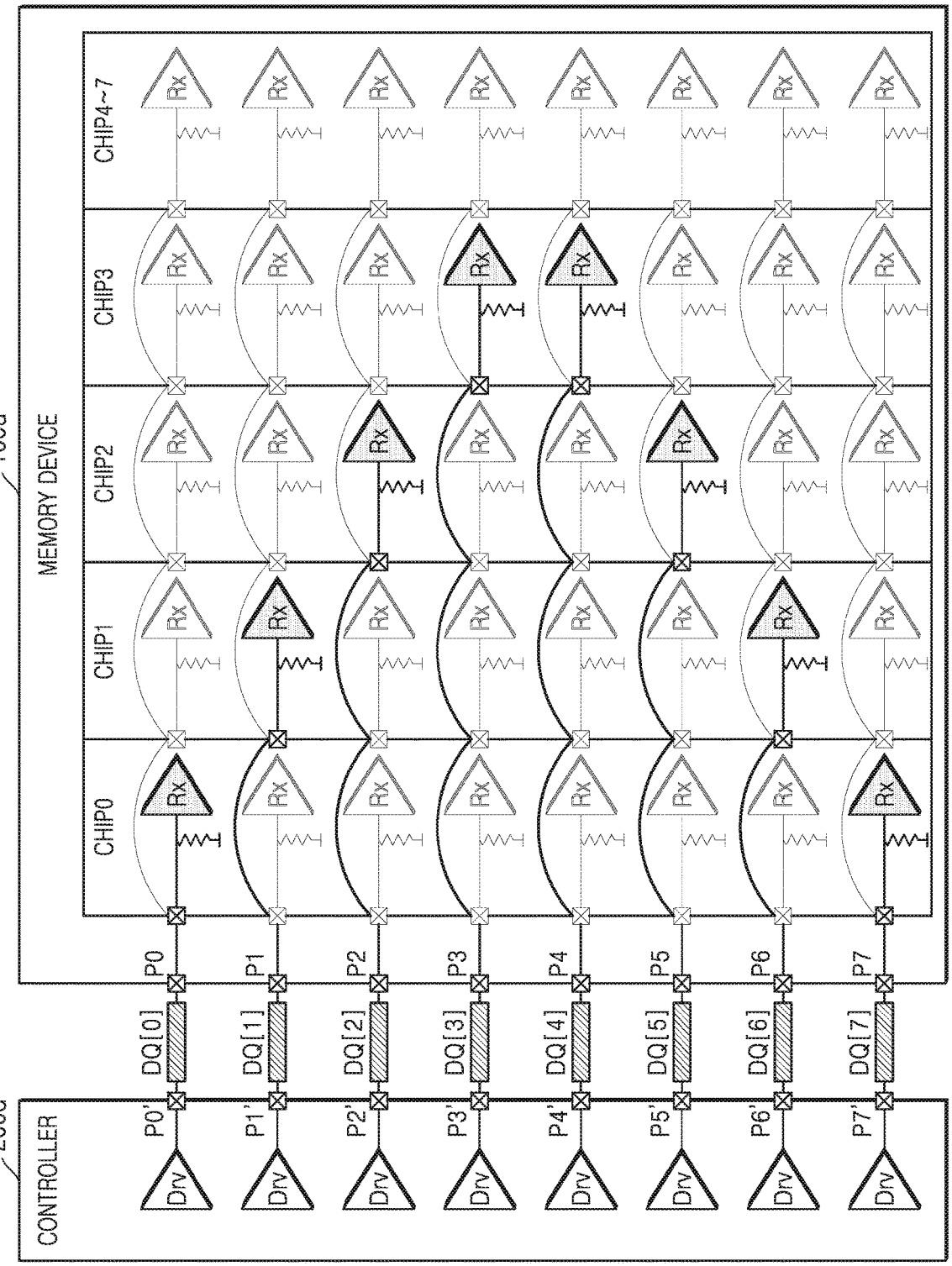
FIG. 6A is a block diagram which illustrates an operation of a memory device according to an embodiment of the inventive concept.
Figure 6B:
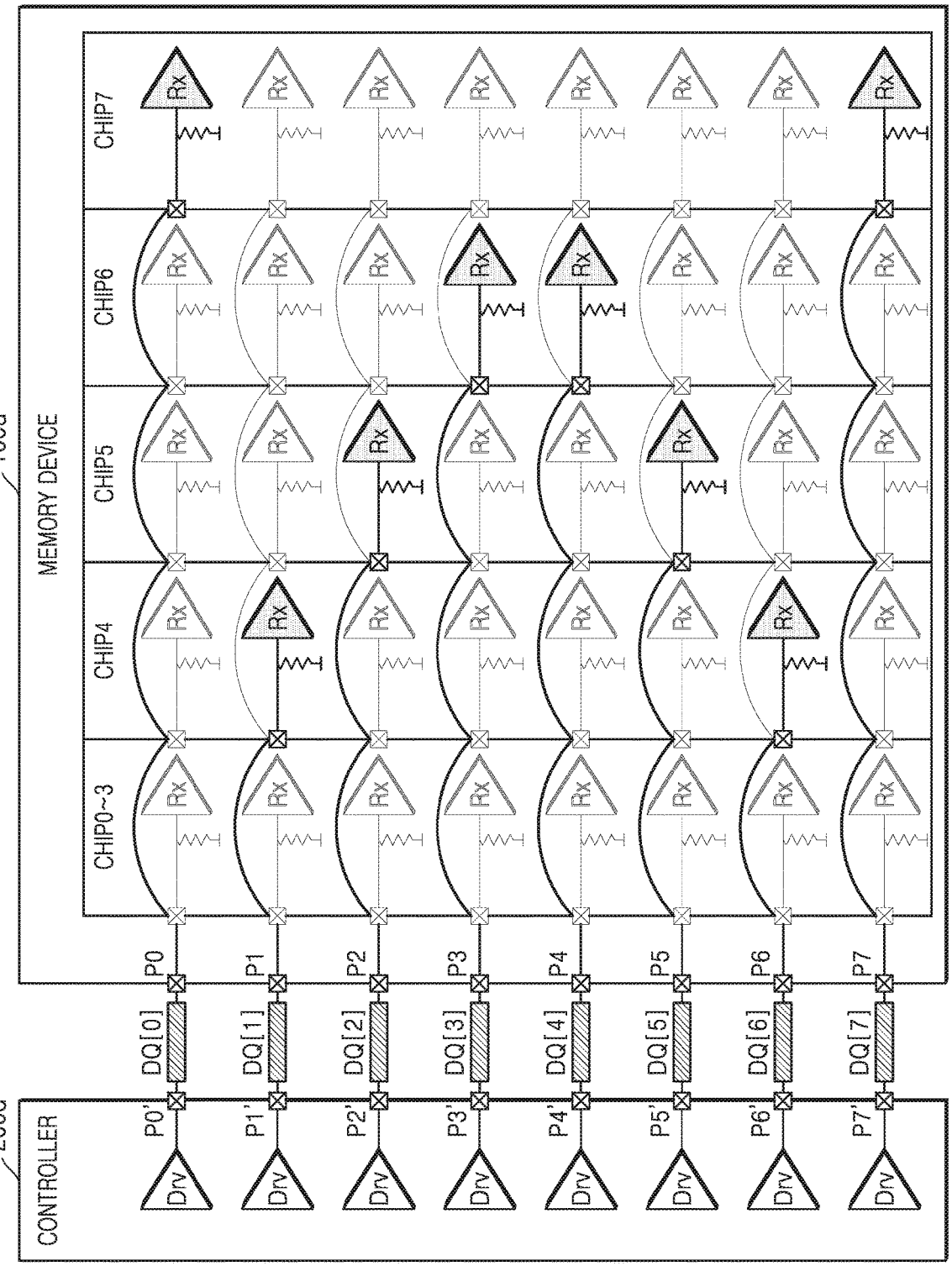
FIG. 6B is a block diagram which illustrates an operation of a memory device according to an embodiment of the inventive concept.

FIGS. 6A and 6B are block diagrams which illustrate operations of a memory device according to an embodiment of the inventive concept. In detail, FIGS. 6A and 6B are diagrams which illustrate a selection of two groups of memory chips from among a plurality of memory chips in a memory device, and a selection of receivers as first receivers in the first group.

Referring to FIGS. 6A and 6B, a memory system 10d may include a memory device 100d, a controller 200d, and a channel. The channel may include a plurality of data signal lines, for example first to eighth data signal lines DQ[0] to DQ[7]. The memory device 100d may include a plurality of memory chips which share the channel, for example first to eighth memory chips CHIP0 to CHIP7. FIG. 6A illustrates a selection of a first group of memory chips, and FIG. 6B illustrates a selection of a second group of memory chips.

Referring to FIG. 6A, the controller 200d may select a first group of the plurality of memory chips. For example the controller 200d may select the first through fourth memory chips CHIP0 through CHIP3 as a first group. As illustrated by the darkened areas of FIG. 6A, in the first group, the controller 200d may select a plurality of first receivers for each memory chip of the first group in a manner similar to that illustrated by FIG. 5, and a repeated description will therefore be omitted.

Referring to FIG. 6B, the controller 200d may select a second group of the plurality of memory chips. For example, the controller 200d may select the fifth through eighth memory chips CHIP4 through CHIP7 as the second group. As illustrated by the darkened areas of FIG. 6B, in the second group, the controller 200d may select a plurality of first receivers for each memory chip of the second group in a manner similar to that illustrated by FIG. 5, and a repeated description will therefore be omitted.

Although FIGS. 6A and 6B illustrate an example in which two groups of memory chips are selected, embodiments of the inventive concept are not necessarily limited thereto. For example, the controller 200d may select three or more groups of memory chips from the plurality of memory chips of the memory device 100d which share a channel, and first receivers may be selected from each of the three or more groups.

Referring to FIG. 4, in an embodiment in which a number of the plurality of memory chips which share a channel and the number of the plurality of data signal lines are the same, one first receiver may be selected from the plurality of receivers Rx of each memory chip. In contrast, referring to FIGS. 6A and 6B, in an embodiment in which a plurality of first receivers are selected in a manner similar to the embodiment illustrated by FIG. 5, an amplification strength mismatch or an error which may occur when only one first receiver is selected in each memory chip may be reduced.

Figure 7:
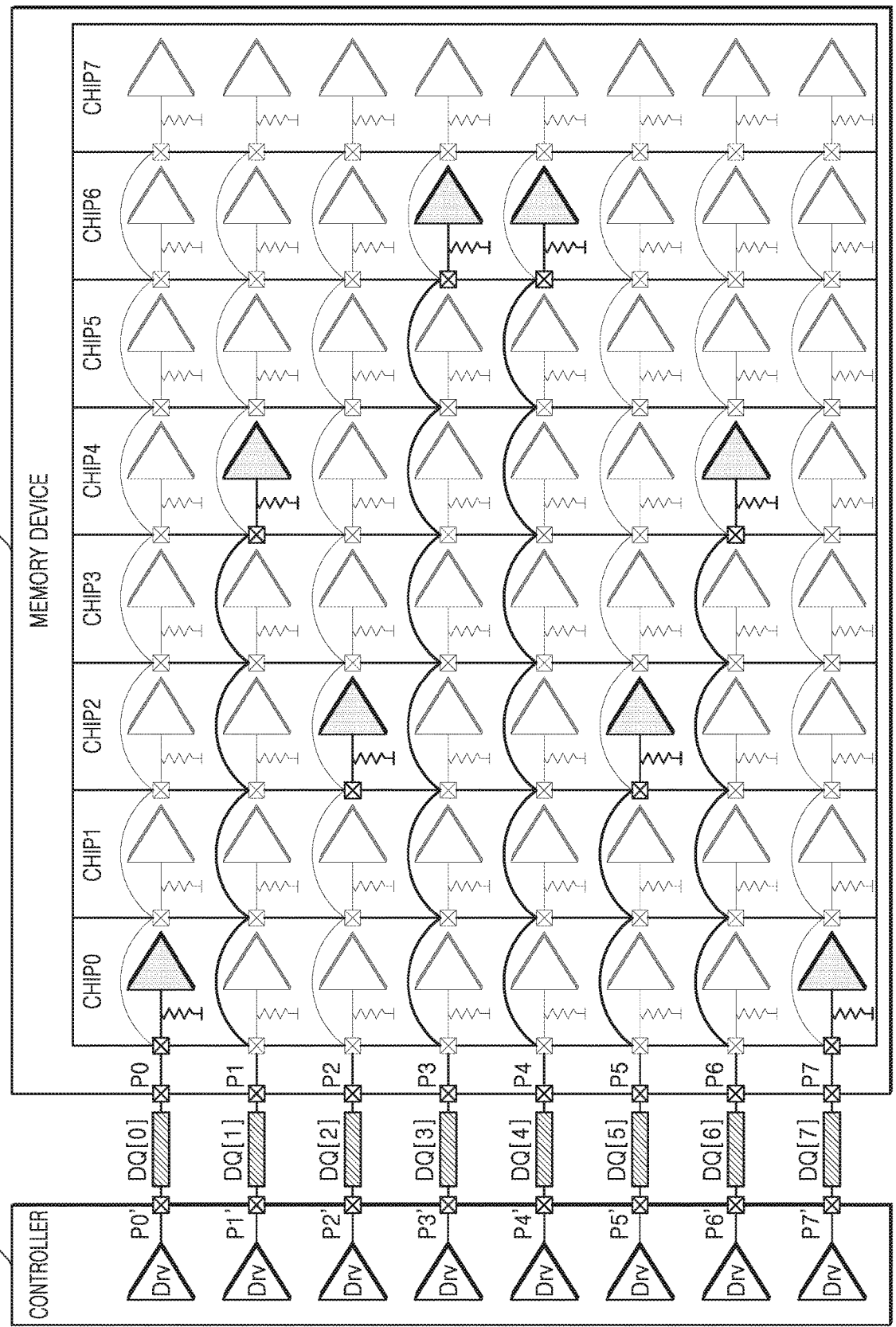
FIG. 7 is a block diagram which illustrates an operation of a memory device according to an embodiment of the inventive concept.

FIG. 7 is a block diagram which illustrates an operation of a memory device according to an embodiment of the inventive concept. In detail, FIG. 7 is a diagram which illustrates a selection of two groups of memory chips from among a plurality of memory chips in a memory device, and a selection of receivers as first receivers in the first group.

In adjacent memory chips, the attenuation of high frequency signals respectively received through a channel may be of a similar degree. Therefore, it may be desirable to select first receivers in a memory chip so that the equalizer circuits of the first receivers may apply their amplification strengths to both the equalizer circuits of the memory chip and to the equalizer circuits of an adjacent memory chip.

Referring to FIG. 7, a memory system 10e may include a memory device 100e, a controller 200e, and a channel. The channel may include a plurality of data signal lines, for example first to eighth data signal lines DQ[0] to DQ[7]. The memory device 100e may include a plurality of memory chips which share the channel, for example first to eighth memory chips CHIP0 to CHIP7. The controller 200e may select groups of the memory chips. For example, as illustrated by the darkened areas of FIG. 7, the controller 200e may select the first memory chip CHIP0, the third memory chip CHIP2, the fifth memory chip CHIP4, and the seventh memory chip CHIP6 as the first group, and may select remaining memory chips as the second group. The controller 200e may select multiple receivers Rx as first receivers from each memory chip of the first group, and each first receiver may respectively correspond to a data signal line of the plurality of data signal lines, as illustrated by the darkened areas of FIG. 7.

As described below with reference to FIG. 11, after the training operations are performed and amplification strengths of each equalizer circuit of each first receiver are set to an optimal amplification strength, a memory chip included in the first group may apply any one of an average value, a maximum value, and a minimum value of the amplification strength of equalizer circuit included in the first receivers of the memory chip to the equalizer circuits of the memory chip and also to an adjacent memory chip in the second group. For example, a first memory chip CHIP0 in the first group may apply any one of an average value, a maximum value, and a minimum value of amplification strengths of equalizer circuits of first receivers in the first memory chip CHIP0 to the equalizer circuits of the second memory chip CHIP1, which is in the second group.

However, embodiments of the inventive concept are not necessarily limited thereto. For example, as described above with reference to FIG. 4, a single first receiver may be selected per memory chip.

Figure 8:
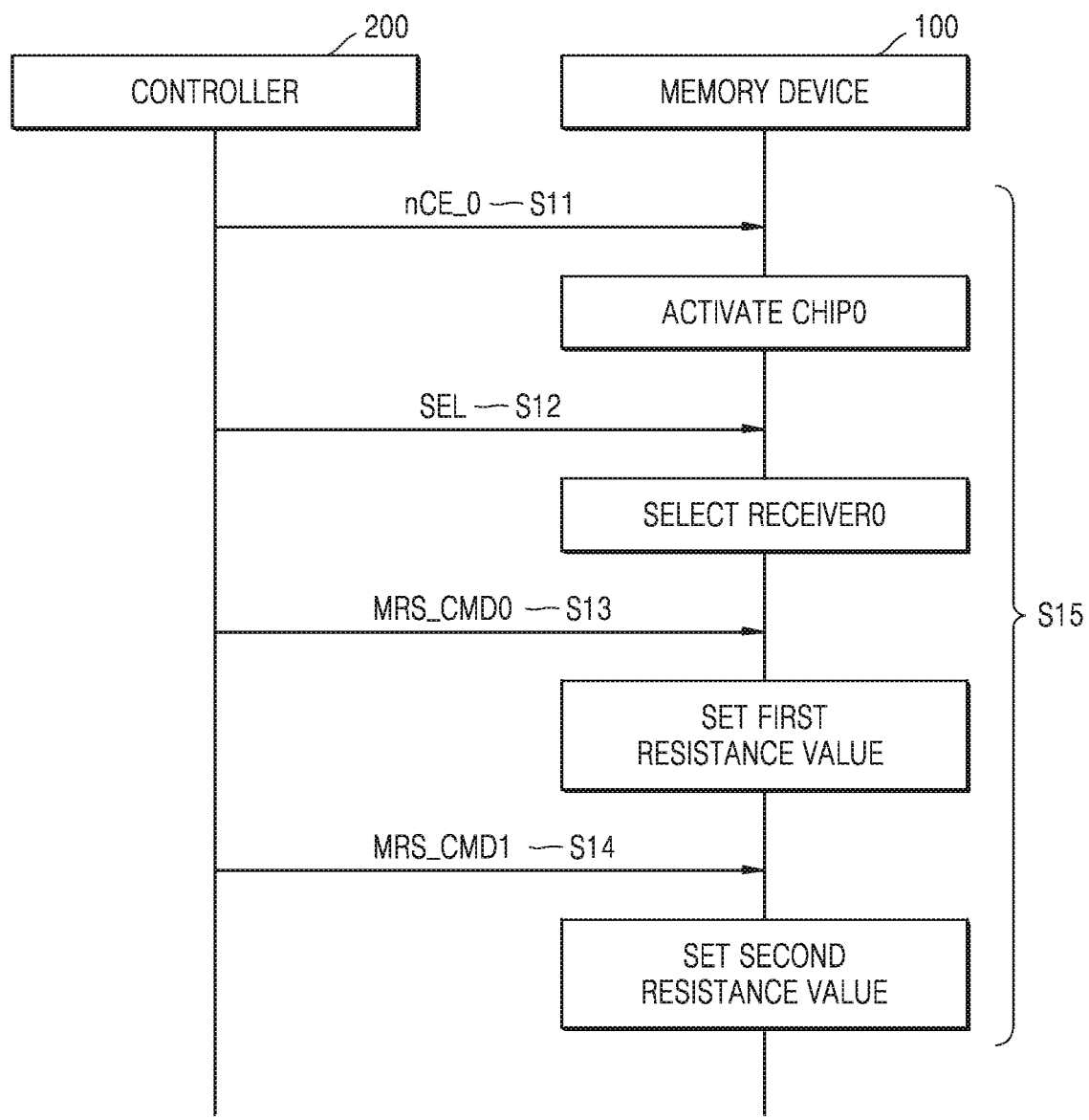
FIG. 8 is a flowchart which illustrates operations between a controller and a memory device according to an embodiment of the inventive concept.

FIG. 8 is a flowchart which illustrates operations between the controller 200 and the memory device 100, according to an embodiment of the inventive concept.

Referring to FIG. 8, in operation S11, the controller 200 may transmit a chip enable signal nCE_0 to a first memory chip CHIP0 to be trained. The first memory chip CHIP0 may activate in response to the chip enable signal nCE_0.

In operation S12, the controller 200 may transmit a selection control signal SEL which may have a different value for each data signal line in the plurality of data signal lines to the memory device 100. The memory device 100 may select at least one receiver of the plurality of receivers as a first receiver RECEIVER0 in the first memory chip CHIP0 in response to the selection control signal SEL. Each receiver may be respectively connected to a data signal line of the plurality of data signal lines.

In operation S13, the controller 200 may transmit a first mode register setting command MRS_CMD0 to the memory device 100. The memory device 100 may set each ODT resistor which is connected to a first receiver RECEIVER0 to a first resistance value in response to the first mode register setting command MRS_CMD0. The memory device 100 may set the ODT resistors which are connected to the first receivers RECEIVER0 to a first resistance value by writing a first bit to a mode register in the memory chip.

In operation S14, the controller 200 may transmit a second mode register setting command MRS_CMD1 to the memory device 100. The memory device 100 may set each ODT resistor which is connected to the receivers which have not been selected as first receivers to a second resistance value in response to the second mode register setting command MRS_CMD1. The memory device 100 may set the ODT resistors which are connected to the receivers which have not been selected as first receivers to a second resistance value by writing a second bit to the mode register.

In operation S15, the memory device 100 may repeated operations S11 through S14 for other memory chips to be trained. For example, when the memory device 100 includes one package chip including a plurality of memory chips, the memory device 100 may sequentially set each ODT resistor of each memory chip of the plurality of memory chips to be trained by performing operations S11 through S14 for each of the plurality of memory chips. As described below with reference to FIG. 10, when the ODT resistors of the memory chips to be trained are set, the memory device 100 may simultaneously perform training operations on the memory chips.

Figure 9:
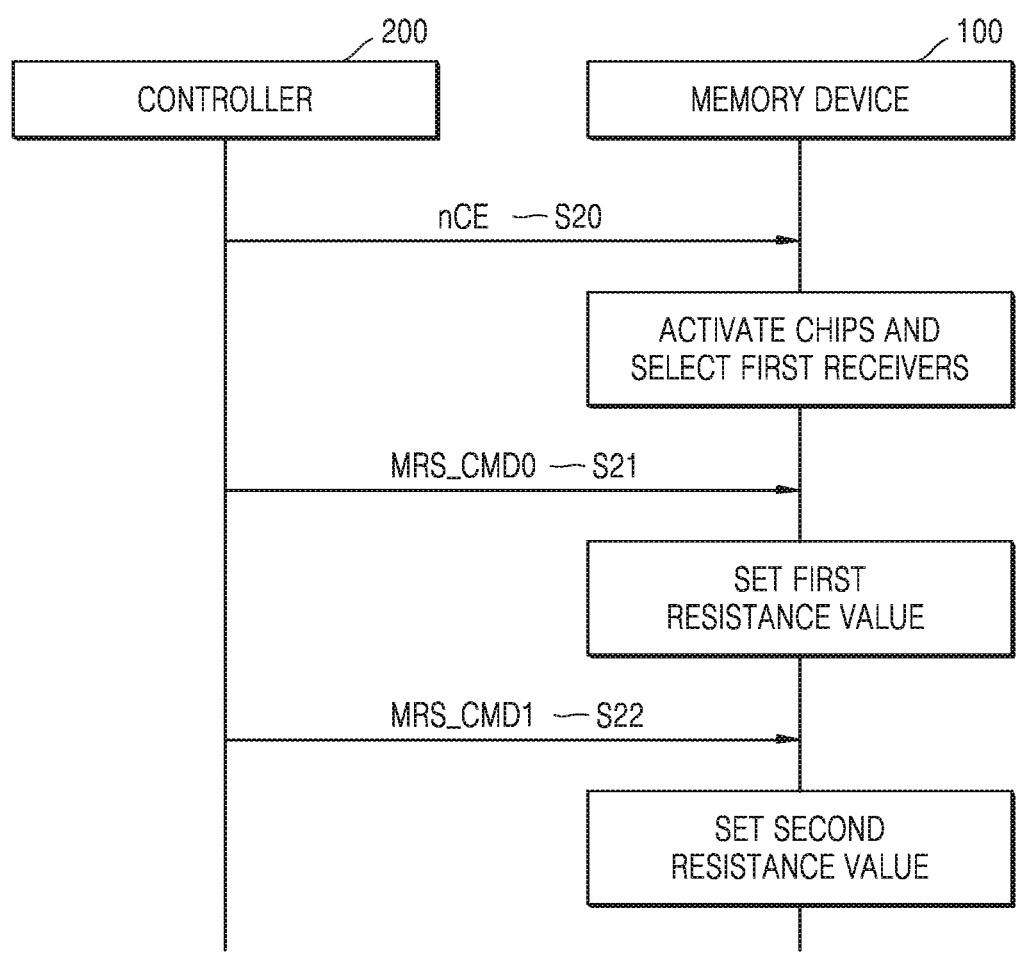
FIG. 9 is a flowchart which illustrates operations between a controller and a memory device according to an embodiment of the inventive concept.

FIG. 9 is a flowchart which illustrates operations between the controller 200 and the memory device 100 according to an embodiment of the inventive concept.

In some embodiments of the inventive concept, each memory chip in a package chip may have a chip identification number which corresponds to a data signal line of the plurality of data signal lines, and the controller 200 may select a receiver in the memory chip as a first receiver based on the chip identification number. For example, a memory chip may have an $N^{th}$ chip identification number, and the controller 200 may select a receiver of the memory chip which is connected to an $N^{th}$ data signal line DQ[N] as a first receiver.

Referring to FIG. 9, in operation S20, the controller 200 may simultaneously transmit a chip enable signal nCE to a plurality of memory chips in the memory device 100 to be trained. The memory device 100 may activate the plurality of memory chips in response to the chip enable signal nCE and may select at least one receiver of the plurality of receivers as a first receiver in each of the plurality of memory chips based on a chip identification number of each of the plurality of memory chips. In operation S21, the plurality of memory chips may set each ODT resistor which is connected to a first receiver to a first resistance value in response to a first mode register setting command MRS_CMD0. In operation S22, the plurality of memory chips may set each ODT resistor which is connected to receiver which has not been selected as a first receiver to a second resistance value in response to a second mode register setting command MRS_CMD1.

Figure 10:
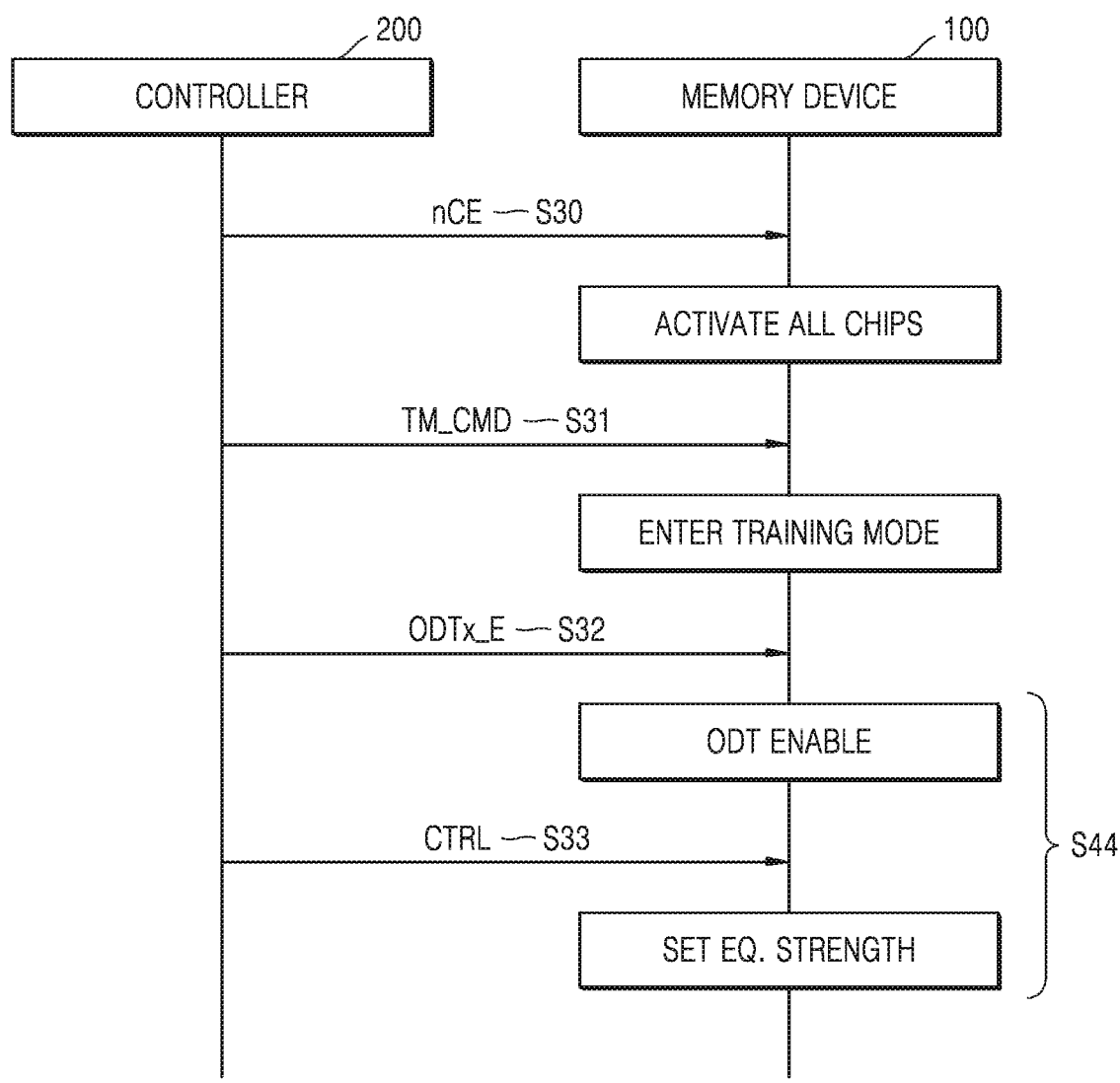
FIG. 10 is a flowchart which illustrates operations between a controller and a memory device according to an embodiment of the inventive concept.

FIG. 10 is a flowchart which illustrates operations between the controller 200 and the memory device 100 according to an embodiment of the inventive concept. For example, the flowchart of FIG. 10 illustrates training operations which may follow operation S14 of FIG. 8 or operation S22 of FIG. 9.

Referring to FIG. 10, in operation S30, the controller 200 may transmit a chip enable signal nCE to a plurality of memory chips in the memory device 100 to be trained. The plurality of memory chips may be simultaneously activated in response to the chip enable signal nCE.

In operation S31, the controller 200 may transmit a training mode command TM_CMD to the memory device 100. The memory device 100 may enter a training mode in response to the training mode command TM_CMD.

In operation S32, the controller 200 may transmit a first ODT control signal ODTx_E to the memory device 100. The memory device 100 may enable the ODT resistors in the plurality of memory chips in response to the first ODT control signal ODTx_E. As described with reference to FIGS. 7 and 8, each ODT resistor may have a set resistance value. For example, each ODT resistor which is connected to a first receiver may have been set to have a first resistance value, and each ODT resistor which is connected to a receiver which is not a first receiver may have been set with a second resistance value.

In operation S33, the controller 200 may transmit a control signal CTRL to the memory device 100. The control signal CTRL may include control code information for respectively setting an amplification strength of an equalizer circuit in each of the first receivers. In response to the control code information, the memory device 100 may generate a control code. Based on the control code, the memory device 100 may set an equalizer circuit in each of the first resistors to have an amplification strength which corresponds to an amplification strength interval from among a plurality of amplification strength intervals.

Figure 11:
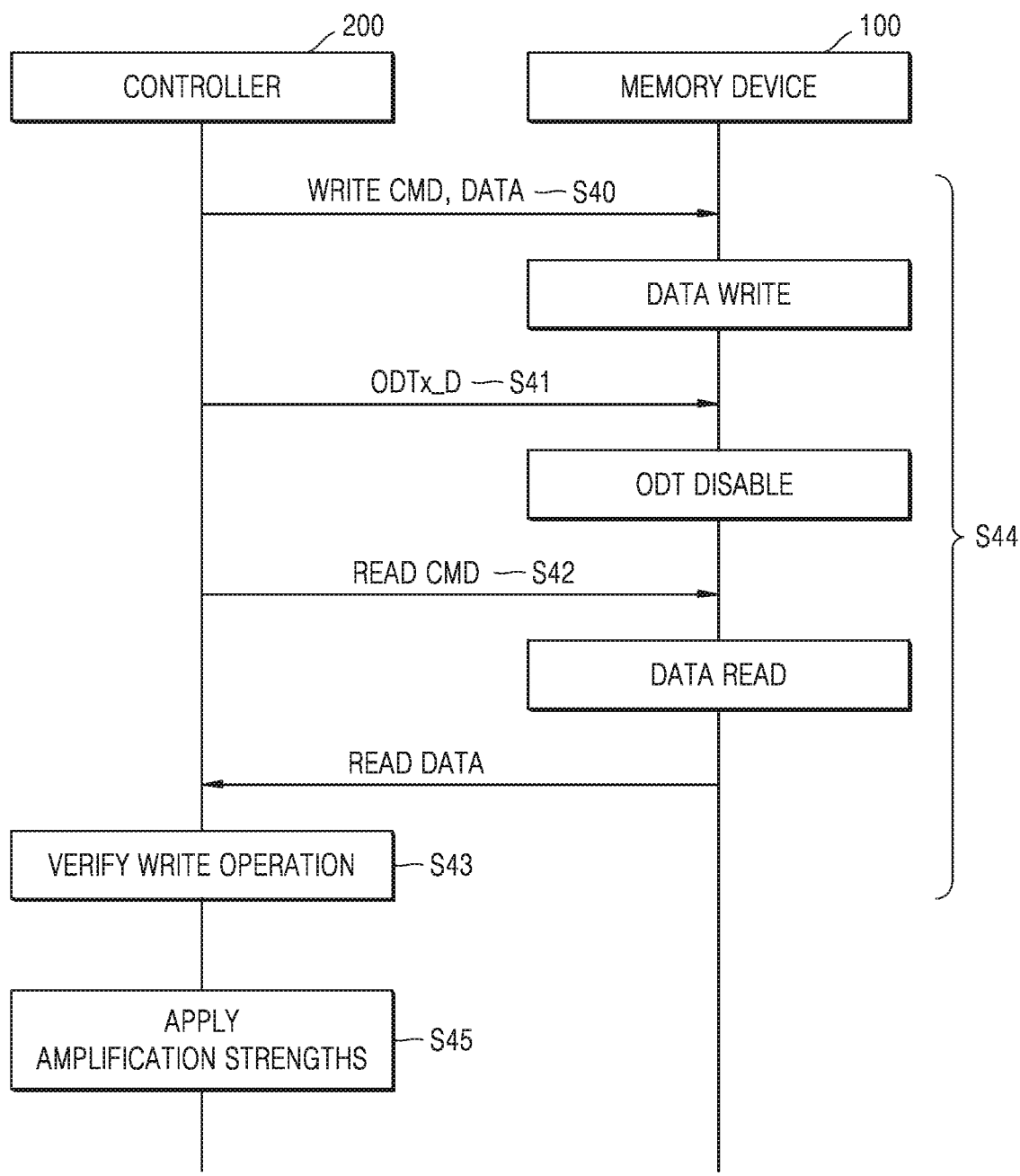
FIG. 11 is a flowchart which illustrates operations between a controller and a memory device according to an embodiment of the inventive concept.

FIG. 11 is a flowchart illustrating operations between the controller 200 and the memory device 100, according to an embodiment of the inventive concept. For example, the flowchart of FIG. 11 illustrates operations which may follow operation S33 of FIG. 10.

In operation S40, in a write operation, the controller 200 may transmit a write command WRITE CMD and write data DATA to the memory device 100. The memory device 100 may program the write data to memory cells in the memory device 100 in response to the write command WRITE CMD. The write data DATA may correspond to each equalizer circuit of each first receiver, and each equalizer circuit may respectively correspond to a memory cell.

In operation S41, the controller 200 may transmit a second ODT control signal ODTx_D to the memory device 100. The memory device 100 may disable the ODT resistors in response to the second ODT control signal ODTx_D. Accordingly, in subsequent operations, the memory device 100 may verify the write operation.

In operation S42, the controller 200 may transmit a read command READ CMD to the memory device 100. The memory device 100 may generate read data READ DATA by reading the write data DATA programmed to the memory cells in response to the read command READ CMD. The memory device 100 may transmit the read data READ DATA to the controller 200.

In operation S43, the controller 200 may verify the write operation by comparing the write data DATA with the received read data READ DATA. In an embodiment, the controller 200 may verify the write operation by measuring a pass interval which corresponds to the amplification strength of each equalizer circuit of each first receiver by adjusting a data strobe signal or a reference voltage level which correspond to the write data DATA and the received read data READ DATA. For example, the controller 200 may measure the pass interval based on a horizontal eye opening area of a data eye-diagram which corresponds to the write data DATA and the received read data READ DATA by adjusting the data strobe signal. Alternatively, the controller may measure the pass interval based on a vertical eye opening area of the data eye-diagram by adjusting the reference voltage level.

In operation S44, the memory device 100 may repeatedly perform operations S32 through S43 for each of a plurality of amplification strength intervals and pass intervals until each equalizer circuit of each first receiver has been set to an optimal amplification strength. Each pass interval may respectively correspond to an amplification strength interval. The controller 200 may determine an optimal amplification strength of each equalizer circuit in a first receiver by identifying a broadest pass interval (that is, a pass interval that, if it were broader, would result in the write operation failing the verification operation) which corresponds to an amplification strength interval. The memory device 100 may accordingly set an amplification strength of each equalizer circuit of each first receiver to an amplification strength which corresponds to an amplification strength interval which corresponds to the broadest pass interval.

In operation S45, the controller 200 may apply the amplification strength of an equalizer circuit of a first receiver in a memory chip to each equalizer circuit of the memory chip and/or an adjacent memory chip, or may apply any one of an average value, a maximum value, and a minimum value of the amplification strengths of equalizer circuits included in the first receivers of a memory chip to each equalizer circuit of the memory chip, and/or an adjacent memory chip, based on first receivers which have been selected as described with reference to FIGS. 4-7 above.

Figure 12:
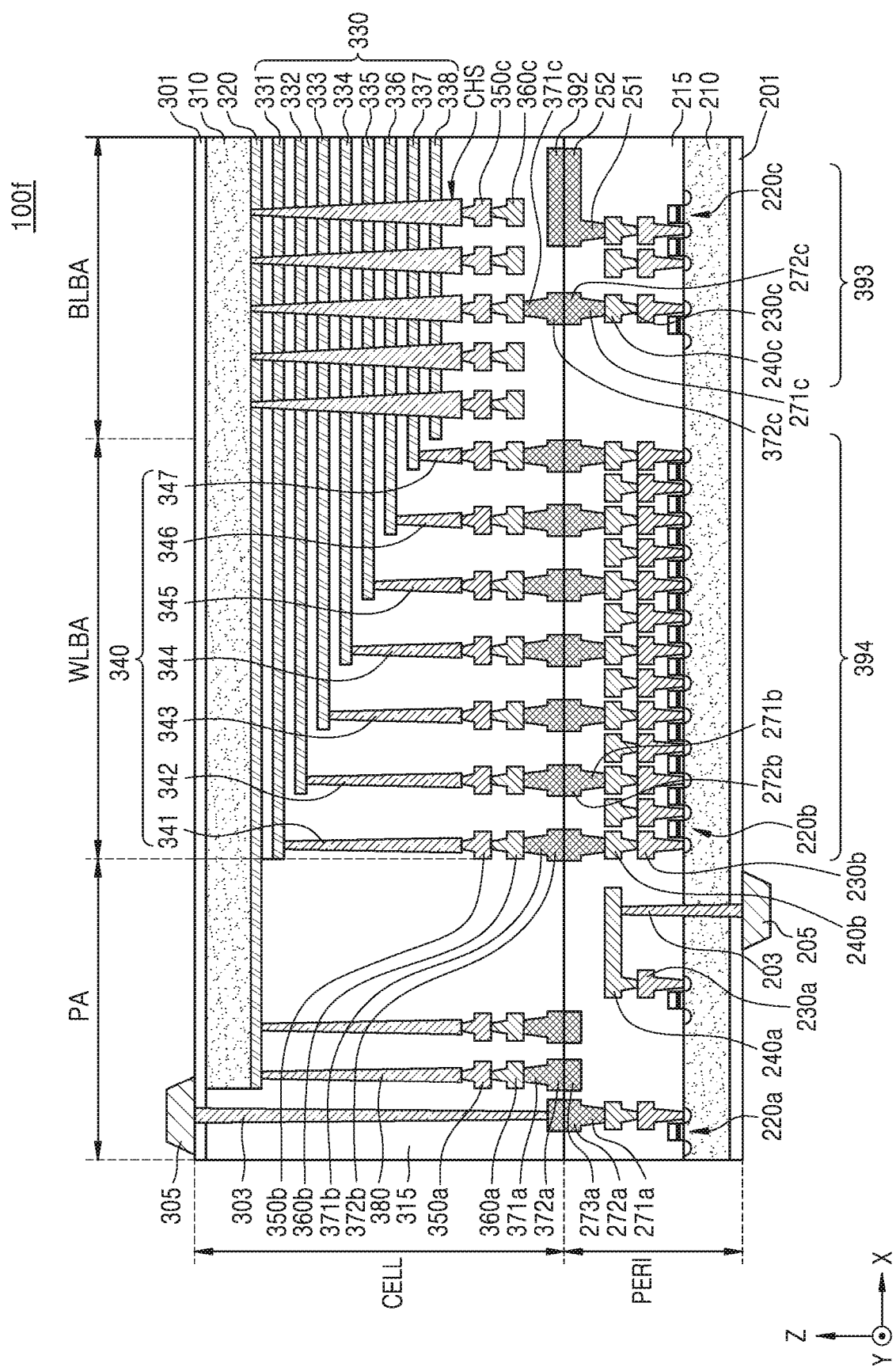
FIG. 12 is a cross-sectional view of a memory device according to an embodiment of the inventive concept.

FIG. 12 is a cross-sectional view of a memory device 100*f* according to another example embodiment.

In detail, FIG. 12 illustrates a three-dimensional (3D) VNAND structure which may be implemented as a memory device according to an embodiment of the inventive concept.

Referring to FIG. 12, a memory device 100*f* may have a chip-to-chip (C2C) structure. A C2C structure may refer to a structure which is formed by manufacturing an upper chip including a cell region CELL on a first wafer, manufacturing a lower chip including a peripheral circuit region PERI on a second, separate wafer, and bonding the upper chip and the lower chip to each other in a bonding process. The bonding process may include a method of electrically connecting a bonding metal formed on an uppermost metal layer of the upper chip and a bonding metal formed on an uppermost metal layer of the lower chip. In an embodiment, the bonding metals may include copper (Cu) and the bonding process may be a Cu-to-Cu bonding process. However, embodiments of the inventive concept may not necessarily be limited thereto. For example, the bonding metals may be formed of aluminum (Al), tungsten (W), or the like.

Each of the peripheral circuit region PERI and the cell region CELL of the memory device 100*f* may include an external pad bonding area PA, a word line bonding area WLBA, and a bit line bonding area BLBA.

The peripheral circuit region PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the plurality of circuit elements 220*a*, 220*b*, and 220*c*, and second metal layers 240*a*, 240*b*, and 240*c* formed on the first metal layers 230*a*, 230*b*, and 230*c*. In an embodiment, the first metal layers 230*a*, 230*b*, and 230*c* may be formed of tungsten, which has a relatively high electrical resistivity, and the second metal layers 240*a*, 240*b*, and 240*c* may be formed of copper, which has a relatively low electrical resistivity.

, Although FIG. 12 only illustrates the first metal layers 230*a*, 230*b*, and 230*c* and the second metal layers 240*a*, 240*b*, and 240*c*, embodiments of the inventive concept are not necessarily limited thereto, and one or more additional metal layers may be further formed on the second metal layers 240*a*, 240*b*, and 240*c*. At least a portion of the one or more additional metal layers formed on the second metal layers 240*a*, 240*b*, and 240*c* may be formed of a material such as aluminum which has a lower electrical resistivity than copper.

The interlayer insulating layer 215 may be disposed on the first substrate 210 and may cover the plurality of circuit elements 220*a*, 220*b*, and 220*c*, the first metal layers 230*a*, 230*b*, and 230*c*, and the second metal layers 240*a*, 240*b*, and 240*c*. The interlayer insulating layer 215 may include an insulating material such as silicon oxide, silicon nitride, or the like.

Lower bonding metals 271*b* and 272*b* may be formed on the second metal layer 240*b* in the word line bonding area WLBA. In the word line bonding area WLBA, the lower bonding metals 271*b* and 272*b* in the peripheral circuit region PERI may be electrically bonded to upper bonding metals 371*b* and 372*b* of the cell region CELL. The lower bonding metals 271*b* and 272*b* and the upper bonding metals 371*b* and 372*b* may be formed of aluminum, copper, tungsten, or the like. Further, the upper bonding metals 371*b* and 372*b* in the cell region CELL may be referred as first metal pads and the lower bonding metals 271*b* and 272*b* in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a third, vertical direction (a Z-axis direction) which is perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in the third, vertical direction (the Z-axis direction) which is perpendicular to the upper surface of the second substrate 310, and may pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first horizontal direction (a Y-axis direction) which is parallel to the upper surface of the second substrate 310.

An area in which the channel structure CH, the bit line 360c, and the like may be disposed may be defined as the bit line bonding area BLBA. In the bit line bonding area BLBA, a page buffer 393 in the peripheral circuit region PERI may include the bit line 360c which is electrically connected to the circuit elements 220c. The bit line 360c may be connected to upper bonding metals 371c and 372c in the cell region CELL, and the upper bonding metals 371c and 372c may be connected to lower bonding metals 271c and 272c which are connected to the circuit elements 220c of the page buffer 393. In an embodiment, a write operation (i.e., a program operation) may be executed based on a page unit, as write data of the page unit may be stored in the page buffer 393, and a read operation may be executed based on a sub-page unit, as read data of the sub-page unit may be stored in the page buffer 393. In an embodiment, in the write operation and the read operation, units of data which may be transmitted through the bit lines may be different from each other.

In the word line bonding area WLBA, the plurality of word lines 330 may extend in a second horizontal direction (an X-axis direction) which is parallel to the upper surface of the second substrate 310 and perpendicular to the first horizontal direction. The plurality of word lines 330 may be connected to a plurality of cell contact plugs 341 to 347 (i.e., 340). The plurality of word lines 330 and the plurality of cell contact plugs 340 may be connected to each other in pads included in at least a portion of the plurality of word lines 330 which extend in different lengths in the second horizontal direction. A first metal layer 350b and a second metal layer 360b may be connected to an upper portion of the plurality of cell contact plugs 340 which are connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b which may form a row decoder 394 in the peripheral circuit region PERI. In an embodiment, operating voltages of the circuit elements 220b of the row decoder 394 may be different than operating voltages of the circuit elements 220c which may form the page buffer 393. For example, operating voltages of the circuit elements 220c which form the page buffer 393 may be greater than operating voltages of the circuit elements 220b which form the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be sequentially stacked on an upper portion of the common source line contact plug 380. For example, an area in which the common source line contact plug 380, the first metal layer 350a, and the second metal layer 360a are disposed may be referred to as the external pad bonding area PA.

Input-output pads 205 and 305 may be disposed in the external pad bonding area PA. Referring to FIG. 12, a lower insulating film 201 which covers a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c which are disposed in the peripheral circuit region PERI through a first input-output contact plug 203, and the first input-output pad 205 may be separated from the first substrate 210 by the lower insulating film 201. In addition, the first input-output contact plug 203 may be electrically separated from the first substrate 210 by a side insulating film which may be disposed therebetween.

Referring to FIG. 12, an upper insulating film 301 which may cover the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c which are disposed in the peripheral circuit region PERI through a second input-output contact plug 303. In an embodiment, the second input-output pad 305 may be electrically connected to a circuit element 220a.

In some embodiments, the second substrate 310 and the common source line 320 may be omitted from an area in which the second input-output contact plug 303 is disposed. Also, the second input-output pad 305 might not overlap the word lines 330 in the third, vertical direction (the Z-axis direction). Referring to FIG. 12, the second input-output contact plug 303 may be separated from the second substrate 310 in a direction which is parallel to the upper surface of the second substrate 310, may pass through the interlayer insulating layer 315 of the cell region CELL, and may be connected to the second input-output pad 305.

In some embodiments, the first input-output pad 205 and the second input-output pad 305 may be selectively formed. For example, the memory device 100f may include only the first input-output pad 205 which is disposed on the first substrate 210 or the second input-output pad 305 which is disposed on the second substrate 310. Alternatively, the memory device 100f may include both the first input-output pad 205 and the second input-output pad 305.

A metal pattern may be provided on an uppermost metal layer as a dummy pattern, or the uppermost metal layer may be omitted, in each region of the external pad bonding area PA and the bit line bonding area BLBA which are respectively included in the cell region CELL and the peripheral circuit region PERI.

In the external pad bonding area PA, the memory device 100f may include a lower metal pattern 273a which corresponds to an upper metal pattern 372a which is formed in an uppermost metal layer of the cell region CELL and which has the same cross-sectional shape as the upper metal pattern 372a of the cell region CELL. The lower metal pattern 273a and the upper metal pattern 372a may be connected to each other in an uppermost metal layer of the peripheral circuit region PERI. In the peripheral circuit region PERI, the lower metal pattern 273a which is formed in the uppermost metal layer of the peripheral circuit region PERI may not be connected to a contact. Similarly, in the external pad bonding area PA, an upper metal pattern 372a which corresponds to the lower metal pattern 273a which is formed in an uppermost metal layer of the peripheral circuit region PERI and which has the same shape as a lower metal pattern 273a of the peripheral circuit region PERI may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392 which corresponds to a lower metal pattern 252 which is formed in the uppermost metal layer of the peripheral circuit region PERI and which has the same cross-sectional shape as the lower metal pattern 252 of the peripheral circuit region PERI may be formed in an uppermost metal layer of the cell region CELL. A contact might not be formed on the upper metal pattern 392 which is formed in the uppermost metal layer of the cell region CELL.

In an embodiment, a reinforcement metal pattern which has the same cross-sectional shape as the metal pattern may be formed in an uppermost metal layer in the other one of the cell region CELL and the peripheral circuit region PERI, and may correspond to a metal pattern which is formed in an uppermost metal layer in one of the cell region CELL and the peripheral circuit region PERI. A contact might not be formed on the reinforcement metal pattern.

A memory device, a memory controller, and a memory system according to embodiments of the inventive concept described with reference to the accompanying drawings may be applied to a Toggle DDR 4.0 interface or a toggle interface which may follow Toggle DDR 4.0.

While the inventive concept has been particularly shown and described with reference to embodiments thereof, it will be understood that various changes in form and details may be made therein without departing from the spirit and scope of the present disclosure.

What is claimed is:

1. An operating method of a memory device, the method comprising:
   in response to a selection control signal, selecting a receiver from a plurality of receivers of each memory chip of a plurality of memory chips included in the memory device as a first receiver, wherein the plurality of memory chips share a plurality of data signal lines, wherein each memory chip includes a plurality of on-die termination (ODT) resistors, and the plurality of ODT resistors are respectively connected to the plurality of receivers of each memory chip;
   in response to mode register setting command signals, setting each ODT resistor which is connected to a first receiver to a first resistance value, and setting ODT resistors which are connected to receivers which are not first receivers to a second resistance value; and
   setting an amplification strength of an equalizer circuit of each first receiver by performing training operations, wherein each data signal line of the plurality of data signal lines is respectively connected to a first receiver.

2. The operating method of claim 1, further comprising applying the amplification strength of an equalizer circuit included in a first receiver of a memory chip to equalizer circuits which are included in receivers of the memory chip which are not first receivers.

3. The operating method of claim 1, wherein the selecting a receiver as a first receiver comprises selecting a plurality of receivers as first receivers in each memory chip, and
   wherein the operating method further comprises applying any one of an average value, a maximum value, and a minimum value of the amplification strengths of equalizer circuits included in a plurality of first receivers of a memory chip to equalizer circuits which are included in receivers of the memory chip which are not first receivers.

4. The operating method of claim 1, wherein the training operations comprise:
   simultaneously activating the plurality of memory chips; and
   in response to an ODT control signal, enabling ODT resistors included in each memory chip.

5. The operating method of claim 4, further comprising setting the ODT resistors which are connected to the first receivers to a first resistance value, and setting the ODT resistors which are not connected to the first receivers to a second resistance value.

6. The operating method of claim 1, wherein the training operations comprise:
   in response to a control signal comprising control code information, generating a control code, wherein the amplification strength of an equalizer circuit is based on the control code and corresponds to an amplification strength interval from among a plurality of amplification strength intervals;
   in response to a write command signal, programming write data to a memory cell; and
   in response to a read command signal, generating read data by reading the write data programmed to the memory cell.

7. The operating method of claim 6, further comprising, before the generating of the read data, disabling the ODT resistors included in each memory chip in response to an ODT control signal.

8. The operating method of claim 6, wherein the training operations further comprise repeatedly performing the generating a control code, the programming write data, and the generating read data for each amplification strength interval of the plurality of amplification strength intervals until an optimal amplification strength is determined, and
   wherein setting the amplification strength includes setting the amplification strength to the optimal amplification strength.

9. The operating method of claim 1, wherein the selecting a receiver as a first receiver comprises selecting a receiver as a first receiver based on chip identification information which corresponds to each memory chip of the plurality of memory chips.

10. An operating method of a memory device, the method comprising:
    selecting a first group and a second group of a plurality of memory chips included in the memory device, wherein the plurality of memory chips share a plurality of data signal lines;
    selecting a plurality of receivers in each memory chip in the first group as first receivers;
    setting resistance values of on-die termination (ODT) resistors included in each memory chip, wherein each ODT resistor is respectively connected to a receiver of the plurality of receivers; and
    setting an amplification strength of an equalizer circuit of each first receiver by performing training operations, wherein each data signal line is respectively connected to a first receiver.

11. The operating method of claim 10, wherein the setting resistance values of the ODT resistors comprises, in response to a first signal comprising first mode register setting information, setting each ODT resistor which is connected to a first receiver to a first resistance value.

12. The operating method of claim 10, wherein the training operations comprise:
in response to a control signal comprising control code information, generating a control code, wherein the amplification strength of an equalizer circuit is based on the control code and corresponds to an amplification strength interval from among a plurality of amplification strength intervals;
in response to a write command signal, programming write data to a memory cell; and
in response to a read command signal, generating read data by reading the write data programmed to the memory cell.

13. The operating method of claim 11, wherein the setting of the resistance values of the ODT resistors comprises, in response to a second signal comprising second mode register setting information, setting each ODT resistor which is connected to a receiver which is not a first receiver to a second resistance value.

14. The operating method of claim 11, further comprising applying any one of an average value, a maximum value, and a minimum value of the amplification strengths of equalizer circuits included in the first receivers of a memory chip to equalizer circuits included in receivers of the memory chips which are not first receivers.

15. The operating method of claim 14, wherein the operating method further comprises applying an amplification strength of an equalizer circuit in a first memory chip of the first memory group to equalizer circuits of receivers of a second memory chip of the second group.

16. The operating method of claim 15, wherein the first memory chip and the second memory chip are adjacent to each other.

17. A memory device comprising a plurality of memory chips which share a plurality of data signal lines,
wherein each of the plurality of memory chips comprises:
a plurality of input/output pads which are respectively connected to the plurality of data signal lines; and
a plurality of on-die termination (ODT) resistors which are respectively connected to the input/output pads, and
wherein each of the plurality of memory chips is configured to:
select a first pad from among the plurality of input/output pads in response to a selection control signal;
set an ODT resistor which is connected to the first pad to a first resistance value in response to a mode register setting command signal; and
set each ODT resistor which is connected to a non-selected input/output pad of the plurality of input/output pads to a second resistance value,
wherein each data signal line is respectively connected to a first pad.

18. The memory device of claim 17, wherein each memory chip further comprises a plurality of equalizer circuits which are respectively connected to the plurality of input/output pads, and
wherein an amplification strength of each equalizer circuit which is connected to a non-selected pad in a memory cell is set based on an amplification strength of an equalizer circuit which is connected to the first pad of the memory cell.

19. The memory device of claim 18, wherein selecting the first pad comprises selecting a plurality of first pads from among the plurality of input/output pads, and
wherein an amplification strength of each equalizer circuit which is connected to a non-selected pads in a memory cell is set based on any one of an average value, a minimum value, and a maximum value of amplification strengths of equalizer circuits which are connected to the first pads of the memory cell.

20. The memory device of claim 17, wherein each of the plurality of memory chips further comprises a mode register,
wherein each of the plurality of memory chips is configured to, in response to a first mode register setting command signal, set an ODT resistor which is connected to the first pad of the memory chip to the first resistance value by writing a first bit to the mode register, and
in response to a second mode register setting command signal, set ODT resistors which are connected to the non-selected pads of the memory chip to the second resistance value by writing a second bit to the mode register.

* * * * *